United States Patent [19]

Mueller

[11] Patent Number: 4,887,282
[45] Date of Patent: Dec. 12, 1989

[54] METHOD AND APPARATUS FOR CHANGING THE IMAGING SCALE IN X-RAY LITHOGRAPH

[75] Inventor: Karl-Heinz Mueller, Berlin, Fed. Rep. of Germany

[73] Assignee: Siemens Aktiengesellschaft, Berlin and Munich, Fed. Rep. of Germany

[21] Appl. No.: 119,094

[22] Filed: Nov. 10, 1987

[30] Foreign Application Priority Data

Nov. 18, 1986 [DE] Fed. Rep. of Germany ....... 3639346

[51] Int. Cl.⁴ .............................................. G21K 5/08
[52] U.S. Cl. ....................................... 378/34; 378/208
[58] Field of Search ................. 378/34, 205, 208, 209; 250/491.1, 492.1, 492.2

[56] References Cited

U.S. PATENT DOCUMENTS

| 4,475,223 | 10/1984 | Taniguchi et al. | 375/34 |
| 4,514,857 | 4/1985 | Kimura et al. | 375/34 |
| 4,724,222 | 2/1988 | Feldman | 250/492.2 |

FOREIGN PATENT DOCUMENTS 0134931 11/1982 Japan .
0017247 5/1984 Japan .
0069926 8/1984 Japan .
0106118 10/1984 Japan .

OTHER PUBLICATIONS

H. Schaumburg "Neue Lithografieverfahren in der Halbleitertechnik", *Elektronic*, 1978, No. 11, pp. 59–66.
J. Lyman, "Lithography Steps Ahead to Meet VLSI Challenge", *Elektronics*, Jul. 1983, pp. 121–128.
H. Lüthje, "X—ray Lithography For VLSI", *Philips Techn. Rev.*, vol. 41, 1983/4, No. 5, pp. 150–163.

Primary Examiner—Carolyn E. Fields
Assistant Examiner—David P. Porta
Attorney, Agent, or Firm—Hill, Van Santen, Steadman & Simpson

[57] ABSTRACT

Am improved method for changing the image scale for a lithographic arrangement comprising a synchroton radiation creating a collimated beam of x-radiation passing through a mask onto an object to be structured, characterized by deforming the surface to be structured into a curved surface. The deforming into a curved surface can be either into a cylindrical curved surface or into a spherical curved surface.

24 Claims, 2 Drawing Sheets

METHOD AND APPARATUS FOR CHANGING THE IMAGING SCALE IN X-RAY LITHOGRAPH

BACKGROUND OF THE INVENTION

The present invention is directed to a method and apparatus for changing the imaging scale in x-ray lithography. The apparatus includes a source for generating a collimated beam of radiation, means for positioning a mask in the beam of radiation before an object to be structured, an adjustment or mounting unit for positioning the object in the beam and for alignment of the object relative to the mask.

The progressive miniaturization of micro-electronic components places an extremely high demand on the performance capability of the lithographic methods. Thus, it is currently possible to routinely generate structures having dimension in a micrometer range (d=2-4 $\mu$m), with a light-optical projection predominantly utilized in very large scale integration (VLSI) fabrication.

It has been suggested, as a further improvement in light optical methods, to utilize short-wave ultraviolet light having a wavelength $\tau \approx 200$–$300$ nm. However, the utilization of very short-wave ultraviolet light has a lot of technical problems so that the theoretical limit of resolution of about 0.5–0.8 $\mu$m can probably not be achieved.

One is, therefore, forced to develop new lithographic methods for producing structures in the sub-micron region. For example, see an article by H. Schaumburg "Neue Lithografieverfahren in der Halbleitertechnik", *Elektronik* 1978, No. 11, pp. 59–66. X-ray lithographic methods have, therefore, achieved special significance and their resolution is not limited by diffraction effects as a consequence of the short wavelength of the radiation, which wavelength is approximately $\tau \approx 0.5$–$4$ nm, but by the range of electrons in the photoresist emitted from the layer to be structured. X-ray lithographic equipment having a conventional radiation source for a whole-wafer exposure of wafers are disclosed, for example, in an article by J. Lyman, "Lithography steps ahead to meet VLSI challenge", *Electronics*, July 1983, pp. 121–28. In these apparatus, the transfer of the prescribed structure onto the semiconductor wafer occurs on the basis of a shadow imaging in that the adjustment mask-wafer pairs are exposed with an x-radiation coming from a nearly punctiform source. The imaging of the mask structure onto the wafer surface corresponding to a conical projection occurs with a magnification scale M=1: (1+P/L), which is defined by the distance P (P$\approx$30 $\mu$m) between the mask and wafer and the distance L (L$\approx$30 cm) between the x-ray source and the wafer. The changes in the rated size of the mask and the wafer, which changes occur during the manufacturing process as a consequence of thermal expansion and warping, can be compensated in a simple way in that the conical projection by the imaging scale is correspondingly adapted by changing what is referred to as the proximity distance P. This known method, however, fails when electron synchrotons or, respectively, electron storage rings are utilized as high-intensity x-ray sources. As a consequence of the high collimation degree of the synchroton radiation emitted by the electrons circulating on the circular path, the exposure of the mask-wafer pair arranged at a distance of several meters from the source or storage ring occurs on the basis of nearly exact parallel projection and, thus, L$\approx \infty$. In order to also guarantee a high overlay degree in the synchroton lithography, it must be assured that size variations of mask and wafer can be compensated by adapting the imaging scale.

SUMMARY OF THE INVENTION

The object of the present invention is to provide a method and arrangement for an x-ray lithography with which changes of the imaging scale can be undertaken in synchroton lithography.

This object is achieved by an improvement in a method for changing the imaging scale and x-ray lithography wherein at least one part of the surface of an object to be structured is subjected with collimated radiation passing through a mask preceding the object. The improvement is that the object is deformed, at least in the region to be structured, and that the radius of curvature produced by individual surface points of the deformation is kept constant during the irradiation of the object. The improvement in the apparatus for changing imaging scales in x-ray lithography comprises an improvement in an apparatus having a radiation source for generating a collimated x-radiation, a mask, and means for positioning or holding an object in the x-ray beam and aligned with the mask. One of the improvements is that the means for positioning or holding the object includes means for curving the surface of the object facing the mask. This means for curving the surface can include a holder having a curved surface having grooves connected to a suction or vacuum pump means or the holder having elastic walls which engage the object to apply pressure on a back surface of the object to cause bending thereof.

The advantage obtainable with the invention is especially that the changes in the rated size of the mask and wafer can be compensated by adaptation of the imaging scale.

Other features and objects of the invention will be readily apparent from the following description of the preferred embodiments, the drawings and claims.

DESCRIPTION OF THE PREFERRED EMBODIMENTS

Figure 1:
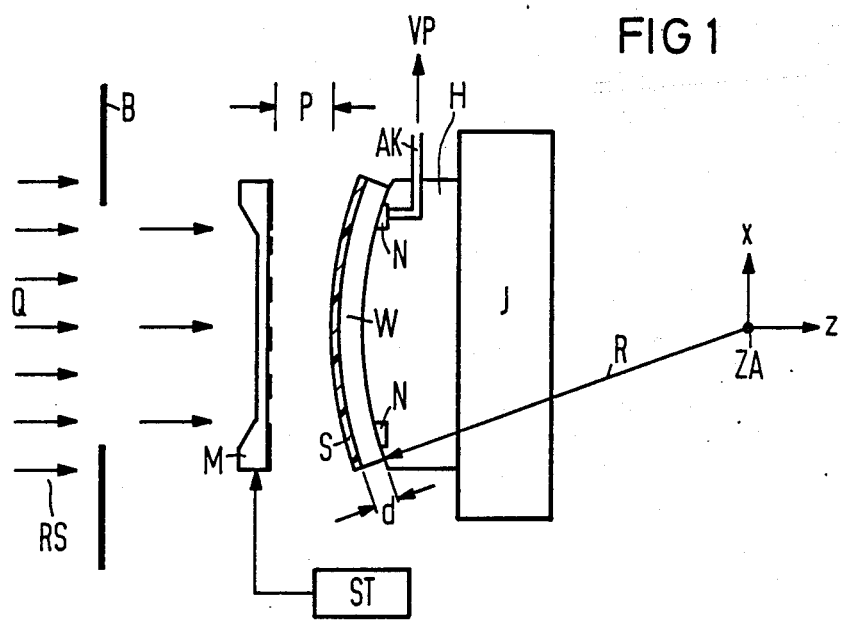
FIG. 1 is a schematic cross sectional view of an arrangement in accordance with the present invention for changing the imaging scale in x-ray lithography utilizing synchroton radiation.

The principles of the present invention are particularly useful when utilized in the apparatus schematically illustrated in FIG. 1. As illustrated in FIG. 1, the apparatus includes a radiation source Q, a mask M carrying the desired structure, an adjustment unit J, which mounts a semiconductor wafer W covered by a radiation-sensitive layer S. The semiconductor wafer W is positioned at a prescribed distance P from the mask M with the assistance of the mounting or holding means H, and the wafer W is aligned relative to the mask. Storage rings or storage accelerators particularly come into consideration as a radiation source Q for x-ray lithography. Synchroton radiation RS, which is emitted tangentially relative to an orbital path by a highly relativistic electrons being coupled out from the path via a vacuum-tight window in the wall of the accelerator ring, are supplied to the apparatus. The wavelength of the synchroton radiation RS can, therefore, be continuously varied over a great range, for example, $0.1 \leq \tau_s \leq 1.00$ nm, by a suitable selection of the machine parameters, such as electron energy, radius of curvature, etc.. Thus, the pattern of the mask M at a distance of several meters from the radiation guide tube of the accelerator can be imaged onto a semiconductor wafer W with a nearly exact, parallel projection as a result of the high degree of collimation of the x-ray radiation RS that is coupled out of the source Q. A further advantage of the synchroton radiation is its high intensity, which enables extremely short exposure times of only a few seconds. As a consequence of limited homogenity of the radiation in the direction perpendicular to the orbital plane of the electrons, however, one is forced to limit the beam cross section to a band shape.

The synchroton beam RS, coming from the source Q, is shaped by a diaphragm system B and is usually brought to the lithographic equipment in an evacuated beam tube to impinge on the mask M, which is fashioned in a known way inside of the chamber that is not illustrated in FIG. 1. Examples of this type of equipment are disclosed in an article by H. Luethje, entitled "X-ray Lithography For VLSI", *Philips Techn. Rev.* Vol. 41, 1983/84, No. 5, pp.150–163. The mask M is usually composed of a radiation-impermeable holding membrane having reinforced edging and of a radiation-permeable metal layer, which is structured according to a mask pattern to be transferred onto the semiconductor wafer W. Adjustment marks are also situated on the masks, and these adjustment marks are optically read during the alignment and are capable of being brought into the desired rated position with the assistance of a control unit ST by displacing the mask M relative to the semiconductor waver W.

As a consequence of the high degree of collimation of the synchroton radiation, the methods known from the area of lithography with punctiform x-ray sources modifying the imaging scale cannot be utilized in the arrangement shown in FIG. 1. It is therefore proposed, in accordance with the invention, that the semiconductor wafer W be deformed, at least in the region to be exposed and that the radius R of curvature produced at the respective surface points by deformation be kept constant during the irradiation. On the basis of a spherical deformation of the semiconductor wafer W, one thus achieves a magnification of the surface lying opposite the mask M in two orthogonal directions relative to one another. This leads to a corresponding scale modification $\epsilon$ in these directions. The quantity $\epsilon$ is, thereby, defined by the quotient $\epsilon = \Delta L/L$, wherein L is a characteristic length and $\Delta L$ is the change in this lenght produced by imaging. The scale modification is based on a projection effect (imaging of the planar mask structure onto a curved surface), and on a stretching of the semiconductor material supplying the smaller quantity.

A cylindrical warping of the object to be exposed requires less of a force exertion and is, technically, simpler to obtain, particularly for semiconductor wafers. In this case, a scale modification occurs in the direction x, as illustrated in FIG. 1, which is perpendicular to the symmetry axis ZA of the cylinder and amounts to $\epsilon_x = d/2R$, wherein d is the thickness of the semiconductor wafer W, and R is the radius of curvature produced by deformation. Given a thickness of $d = 0.6$ mm, and given a scale modification of $\epsilon = 10^{-5}$, usually required in a conventional arrangement, a radius of curvature of $R = 30$ m, which can be technically obtained without trouble, is required.

Given the exemplary embodiment of the arrangement of the invention for modifying the imaging scale as shown in FIG. 1, the deformation of the surface region to be structure occurs with the assistance of a holder H arranged between the semiconductor wafer W and the adjustment unit J. The surface of this holder H at a side facing toward the mask M has a spherical or cylindrical curvature with a radius of curvature R. One or more annular grooves N are formed in the face of the holder and are connected to a vacuum pump VP via channels AK. Thus, the desired surface deformation is automatically set by suctioning the semiconductor wafer W onto the surface of the holder H.

Figure 2:
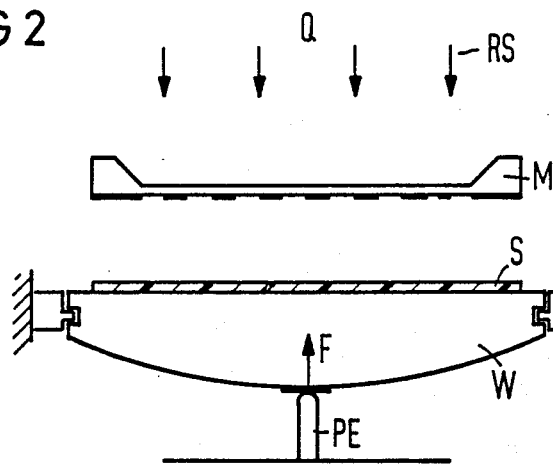
FIG. 2 is a modification of the means for changing the curvature of a semiconductor wafer.

A cylindrical deformation of the semiconductor wafer can also be achieved by a force F which is preferably generated with the assistance of the arrangement illustrated in FIG. 2. In this arrangement, the semiconductor wafer W is held on its edges and a force F is applied to a back surface of the wafer W to cause a bending of the wafer. As illustrated, the force is created by a piezo-electric element PE and is positioned at the center. In order to guarantee a cylindrical deformation over a large surface area, the semiconductor wafer W comprising the planar surface on the side facing toward the mask M and having a convex surface at the side facing away from the mask M is preferably utilized. Thus, the wafer thickness steadily increases from the edge towards the center.

In accordance with the further feature of the invention, the semiconductor wafer can also be held by a holding device having elastic walls. In this arrangement, the wafer is held on its periphery and is deformed by changing the inside pressure of the container with the elastic walls.

Given cylindrical deformation of the semiconductor wafer W, the imaging scale or, respectively, the magnification changes is in only one spatial direction. For example, as illustrated in FIG. 1, in the x direction, with $\epsilon_x = d/2R$. In order to also produce a scale modification in the direction of symmetry axis ZA of the cylinder, which would be the y direction in FIG. 1, it is proposed to sweep the synchroton beam RS, which has been gated out nearly line-shaped, across the mask M in the direction of the cylindrical axis ZA with a constant speed $v_S$. This is executed, for example, with the assistance of a rotatably mounted mirror. Instead of this deflection, the mask M and the semiconductor wafer W can also be drawn through the stationary beam in common and the width b measured in the deflection direction or, respectively, displacement direction, is smaller than the height h. Thus, for example, h is approximately 30 nm, while b is approximately 3 mm. When the mask M is also displaced with a speed $v_M$ relative to the semiconductor wafer W in the direction of the cylindrical axis ZA, then this leads to a change in the magnification $\epsilon_y = v_M/v_S$ and, thus, leads to a modification of the imaging scale in this direction, whereby $\vec{v_S} = v_S \cdot \vec{e_y}$, which refers to the relative speed of the synchroton beam RS relative to the mask M and $\vec{v_M} = v_M \cdot \vec{e_y}$, which is the relative speed of the mask relative to the semiconductor wafer W. A finite width b for the synchroton beam leads to a resolution limit $a = \epsilon_y \cdot b$, which lies at $a = 30$ nm for typical values of $b = 3$ mm and $\epsilon_y = 10^{-5}$.

The described method of the cylindrical deformation in combination with the scale modification on the basis of relative motion has the advantage over the spherical warping because the scale can be set in orthogonal directions independent of one another.

The orthogonal error of the mask M can also be corrected with the method of the invention when the mask M is also additionally displaced with constant speed relative to the semiconductor wafer W in that direction, for example, the x-direction of FIG. 1, which is perpendicular to the cylindrical axis ZA.

Figure 3:
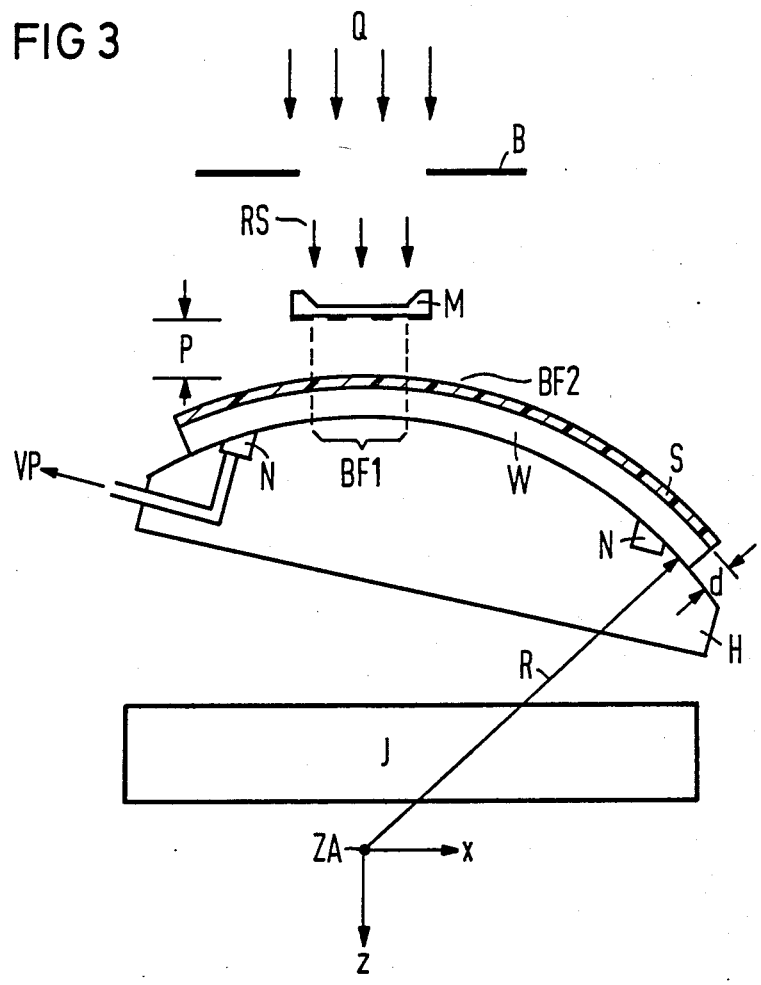
FIG. 3 is a diagrammatic cross sectional view of an arrangement for exposing a large semiconductor wafer in accordance to a step and repeat method.

The invention, of course, can also be employed in a synchroton stepper in which large semiconductor wafers having a diameter of up to 20 cm are structured with the assistance of a step and repeat method. This method is known from lithography with electron beams. In this method, the semiconductor wafer W is successively exposed in sub-regions BF arranged perpendicular relative to one another, and the size of these regions BF is prescribed by the mask field, for example, 4×4 cm. In order to also guarantee a scale variation which is constant over the entire surface of the semiconductor wafer W and is dependent on the radius R of curvature and on the wafer thickness d in the synchroton steppers, the sub-regions BF1, BF2, to be respectively exposed, must be positioned immediately under the mask M by three-dimensional displacement of the semiconductor wafer W, as illustrated in FIG. 3. Care must, therefore, be exercised to see that when using spherical deformation that the center or, when using cylindrical deformation, the points lying on a straight line proceeding through the center of the respective sub-regions, BF1 and BF2, and exhibit the smallest distance P from the mask M. The displacement executed with the assistance of the adjustment unit J then corresponds to the virtual rotation of the semiconductor wafer W around the center of the sphere or, respectively, the rotation around the symmetrical axis ZA of the cylinder.

Although various minor modifications may be suggested by those versed in the art, it should be understood that I wish to embody within the scope of the patent granted hereon all such modifications as reasonably and properly come within the scope of my contribution to the art.

I claim:

1. In a method for changing the imaging scale in x-ray lithography, said method including exposing an object by directing a beam of collimated x-radiation through a mask to transfer an image of a mask structure by parallel projection onto the object which is arranged in a direction of the beam to follow the mask, the improvement comprising changing the imaging scale of the image by deforming the object at least in the region to be exposed into a curved surface and maintaining the radius of curvature for the individual surface points of the area being deformed constant during the irradiation of the object.

2. In a method according to claim 1, wherein the step of deforming deforms the surface of the object with the radius of curvature being constant, at least in the region to be exposed.

3. In a method according to claim 1, wherein the step of deforming comprises providing a holder having a curved surface and pressing the object against said curved surface.

4. In a method according to claim 1, wherein the step of deforming the object comprises holding the edges of the object and applying a force to a back surface of the object facing away from the mask.

5. In a method according to claim 1, wherein the step of bending the object includes providing an object having a thickness steadily increasing from the edges towards the center, holding the object at the edges, and applying a pressure to a back surface of the object facing away from the mask.

6. In a method according to claim 1, wherein the step of deforming the object deforms the object so that the surface facing the mask has a spherical curvature.

7. In a method according to claim 1, wherein the step of deforming the object deforms the object so that the surface facing the mask has a cylindrically curved surface.

8. In a method according to claim 1, wherein the step of directing a beam of x-radiation provides synchroton radiation.

9. In a method according to claim 1, wherein the step of exposing the object exposes the object in a step and repeat process, which includes displacing the object relative to the mask with a three-dimensional displacement at the completion of each step.

10. In a method according to claim 9, wherein the step of repositioning positions each region of the object with the center of the region being on a straight line extending through the mask and having the smallest distance from the mask.

11. In a method for changing the imaging scale in x-ray lithography, said method including directing a beam of collimated x-radiation through a mask onto a surface of an object, the improvement comprising deforming the object at least in the region to be exposed to deform the surface of the object into a cylindrically curved surface having a symmetry cylindrical axis lying in a plane extending perpendicular to a propagation direction of the beam of x-radiation and maintaining the radius of curvature for the individual surface points of the area being deformed constant during the irradiation of the object, shaping the x-ray beam to have a rectangular cross section with a dimension in the direction of the cylindrical axis being smaller than the direction perpendicular to the cylindrical axis, sweeping the x-ray beam across the mask in a direction of the cylindrical axis with a first speed, and displacing the mask relative to the object in the direction of the cylindrical axis with a second speed.

12. In a method according to claim 11, wherein for the correction of orthoganal errors, the mask is displaced with a third speed relative to the object in a direction perpendicular to the cylindrical axis and perpendicular to the propagation further includes displacing the mask relative to the object direction of the x-ray beam.

13. In a method according to claim 11, wherein the step of sweeping the x-radiation across the mask includes providing a rotating mirror and directing the beam from the source onto the mirror, which sweeps it across the mask.

14. In a method according to claim 11, wherein the relative movement is by moving the mask and object through the x-ray beam in common.

15. In an apparatus for changing the imaging scale in an x-ray lithography, said apparatus including a radiation source for generating collimated x-radiation, means for shaping the x-radiation into a beam of x-radiation having a rectangular cross-section, means for supporting a mask in the beam path of the radiation to impose an image in the beam passing through the mask, means for mounting an object adjacent the mask to receive the image on a surface of the object, the improvements comprising means for changing the imaging scale of the image received on said surface comprising the means for mounting including means for holding the object and having means for deforming the object to create a curved surface for the surface of the object facing the mask.

16. In an apparatus according to claim 15, wherein the means for holding includes holding the edges of the object and means for applying force to a back surface of the object to cause the surface facing the mask to be bent into a curved surface.

17. In an apparatus according to claim 15, wherein the means for holding includes a curved surface facing a back surface of the object, said curved surface having at least one groove, said groove being connected by a line to a vacuum pump so that the object is held onto the curved surface by the vacuum applied in said groove.

18. In an apparatus according to claim 17, wherein the surface of the holder has a cylindrically curved surface.

19. In an apparatus according to claim 17, wherein the curved surface of the holder is a spherically curved surface.

20. In an apparatus according to claim 19, wherein the at least one groove is an annular groove.

21. In an apparatus for changing the imaging scale in an x-ray lithography, said apparatus including a radiation source for generating a collimated x-radiation, means for mounting a mask in the beam path of the radiation, means for holding an object adjacent the mask and in alignment with an x-ray beam passing through the mask, the improvement comprising the means for holding including a container having an elastic wall, said object being held on said container, said container having means for changing the pressure in the container to deform the object held on said elastic wall.

22. In a method for changing the imaging scale in x-ray lithography, said method including directing a collimated x-radiation through a mask onto an object, the improvement comprising deforming the object at least in the region to be exposed and maintaining the radius of curvature for the individual surface points of the area being deformed constant during the irradiation of the object, said step of deforming the object comprising holding the edges of the object and applying a force at a single point to a back surface of the object facing away from the mask.

23. In a method for changing the imaging scale in x-ray lithography, said method including directing a collimated x-radiation through a mask onto an object, the improvement comprising deforming the object at least in the region to be exposed and maintaining the radius of curvature for the individual surface points of the area being deformed constant during the irradiation of the object, said step of deforming the object comprising holding the edges of the object and applying a force along a line to a back surface of the object facing away from the mask to obtain a cylindrical curving of the object.

24. In a method for changing the imaging scale in x-ray lithography, said method including directing a collimated x-radiation through a mask onto an object, the improvement comprising deforming the object at least in the region to be exposed and maintaining the radius or curvature for the individual surface points of the area being deformed constant during the irradiation of the object, said step of deforming the object including providing a container having an elastic wall, holding the object on said elastic wall and increasing the pressure in the container to bend the object by the elastic wall.

* * * * *